(12) United States Patent
Neoh

(10) Patent No.: US 8,156,452 B1
(45) Date of Patent: Apr. 10, 2012

(54) METHOD AND APPARATUS FOR IMPORTING HARDWARE DESCRIPTION LANGUAGE INTO A SYSTEM LEVEL DESIGN ENVIRONMENT

(75) Inventor: Hong Shan Neoh, Redwood City, CA (US)

(73) Assignee: Altera Corporation, San Jose, CA (US)

( * ) Notice: Subject to any disclaimer, the term of this patent is extended or adjusted under 35 U.S.C. 154(b) by 839 days.

(21) Appl. No.: 11/143,003

(22) Filed: Jun. 2, 2005

(51) Int. Cl.
 *G06F 17/50* (2006.01)
(52) U.S. Cl. .......................................... 716/100; 716/106
(58) Field of Classification Search .................. 716/1, 2, 716/18, 6, 100–106
 See application file for complete search history.

(56) References Cited

U.S. PATENT DOCUMENTS

| | | | |
|---|---|---|---|
| 5,404,319 A * | 4/1995 | Smith et al. ..................... 716/18 |
| 5,867,400 A * | 2/1999 | El-Ghoroury et al. ............ 716/1 |
| 6,173,435 B1 * | 1/2001 | Dupenloup ................... 716/104 |
| 6,567,971 B1 * | 5/2003 | Banzhaf et al. ................. 716/18 |
| 6,591,403 B1 * | 7/2003 | Bass et al. ........................ 716/5 |
| 6,618,839 B1 * | 9/2003 | Beardslee et al. ................ 716/4 |
| 6,658,633 B2 * | 12/2003 | Devins et al. ..................... 716/5 |
| 6,704,889 B2 * | 3/2004 | Herrmann et al. .............. 714/39 |
| 6,826,717 B1 * | 11/2004 | Draper et al. ................... 714/39 |
| 6,829,753 B2 * | 12/2004 | Lee et al. ......................... 716/5 |
| 6,836,877 B1 * | 12/2004 | Dupenloup .................... 716/18 |
| 6,931,572 B1 * | 8/2005 | Schubert et al. ............... 714/34 |
| 7,076,751 B1 * | 7/2006 | Nixon et al. ...................... 716/5 |
| 7,092,865 B1 * | 8/2006 | Burnley et al. ................. 703/14 |
| 7,134,100 B2 * | 11/2006 | Ravi et al. ........................ 716/2 |
| 7,278,122 B2 * | 10/2007 | Willis .............................. 716/3 |
| 2002/0133788 A1 * | 9/2002 | Waters et al. .................... 716/3 |
| 2002/0170037 A1 * | 11/2002 | Powell .......................... 717/131 |
| 2003/0083855 A1 * | 5/2003 | Fukuyama .................... 703/15 |
| 2005/0076314 A1 * | 4/2005 | Matsui et al. .................... 716/1 |
| 2006/0047494 A1 * | 3/2006 | Tamura et al. ................. 703/19 |

* cited by examiner

*Primary Examiner* — Jack Chiang
*Assistant Examiner* — Binh Tat
(74) *Attorney, Agent, or Firm* — L. Cho

(57) ABSTRACT

A method for importing a design in hardware description language (HDL) into a system level design tool includes setting a sampling time. The simulation model template is generated with the sampling time according to a selected simulation model type.

19 Claims, 6 Drawing Sheets

METHOD AND APPARATUS FOR IMPORTING HARDWARE DESCRIPTION LANGUAGE INTO A SYSTEM LEVEL DESIGN ENVIRONMENT

TECHNICAL FIELD

The present invention relates to the field of system level electronic design automation (EDA) tools. More specifically, the present invention relates to a method and apparatus for importing a design written in hardware description language (HDL) code into a system level environment to be used by a system level EDA tool.

BACKGROUND

System level EDA tools allow a designer to model, simulate, and analyze systems. System level EDA tools such as Simulink® from MathWorks® allow designers to create, simulate, evaluate, and refine a system design model through standard and custom block libraries. Block libraries such as DSP Builder from Altera® Corporation provide digital signal processing (DSP) development tools that interface between system level EDA tools and hardware design flow tools that perform synthesis, placement, and routing.

When designing a system with a system level EDA tool, it is desirable to have the capability to utilize existing designs available written in HDL code. System level EDA tools and block libraries provide limited support for converting designs written in HDL code to a simulation model having a format compatible with the system level EDA tool. This makes it difficult for users to utilize existing designs written in HDL code. Some block libraries impose rules on HDL port declarations where certain signals need to be renamed in order for the block libraries to recognize the signals and make the appropriate connections in the simulation model. In addition, many of these block libraries also do not allow a user of the system level EDA tool to select how a simulation model of a design written in HDL code should be represented in the system level environment.

Thus, what is needed is an improved method and apparatus for importing designs written in HDL code into a system level environment.

SUMMARY

A method and apparatus is disclosed for generating a template for a simulation model from a design written in HDL code. A user is given an option as to how the simulation model is to be represented. According to one embodiment, the simulation model may be represented as a DSP block or a computer language description of the simulation model. The template for the simulation model includes sample times that correspond to clock signals from the design. The template also includes a plurality of input and outputs from the design.

BRIEF DESCRIPTION OF THE DRAWINGS

The features and advantages of the present invention are illustrated by way of example and are by no means intended to limit the scope of the present invention to the particular embodiments shown.

DETAILED DESCRIPTION

In the following description, for purposes of explanation, specific nomenclature is set forth to provide a thorough understanding of embodiments of the present invention. However, it will be apparent to one skilled in the art that these specific details may not be required to practice the embodiments of the present invention. In other instances, well-known components, programs, and procedures may be shown in block diagram form to avoid obscuring embodiments of the present invention unnecessarily.

Figure 1:
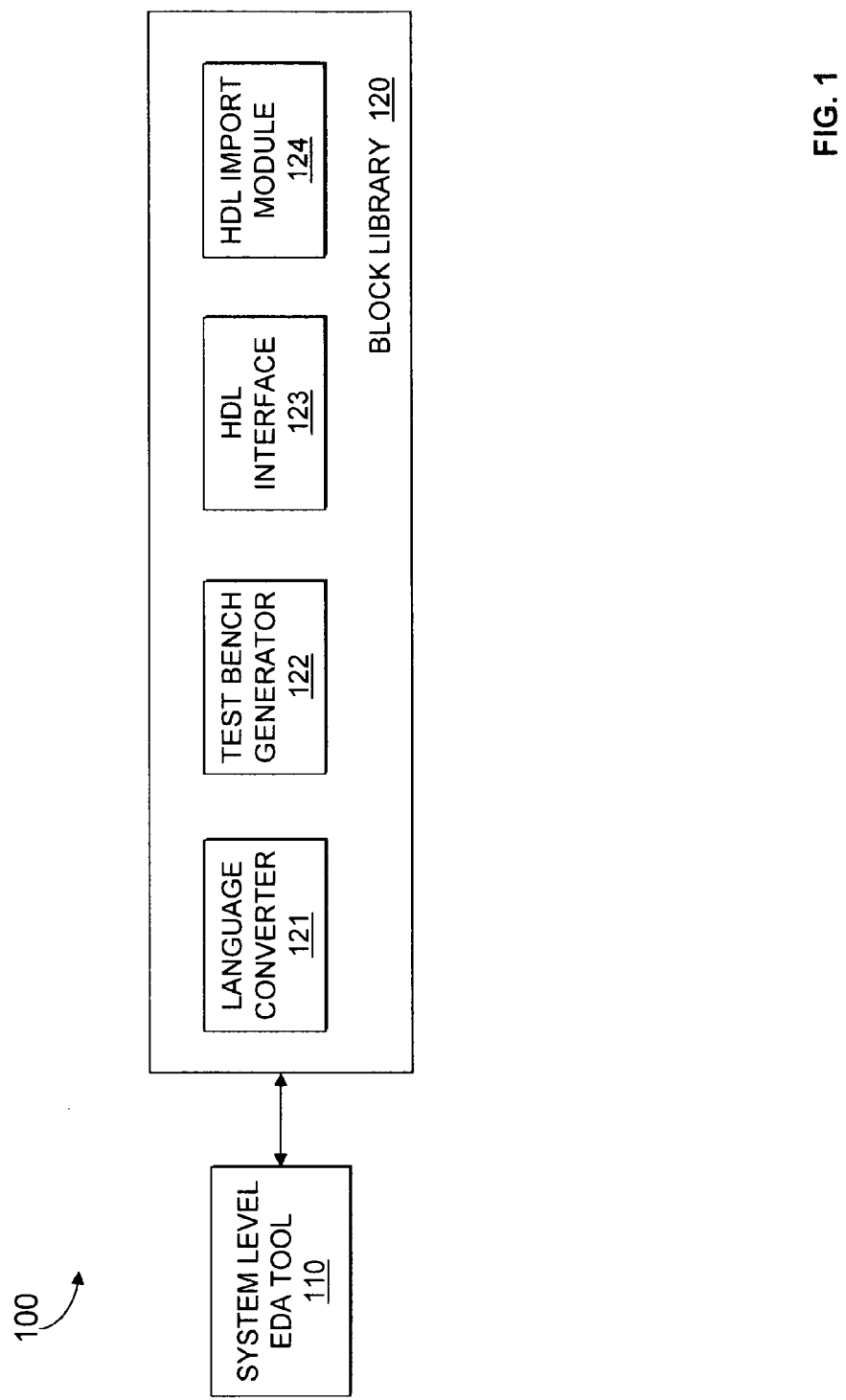
FIG. 1 illustrates a block diagram illustrating a system level EDA tool and a block library according to an embodiment of the present invention.

FIG. 1 illustrates a block diagram of a system designer 100 according to an embodiment of the present invention. The system designer 100 includes a system level EDA tool 110 and a block library 120 which together may be used to create a system design model that reflects an abstract level of design of the system. The system level EDA tool 110 may be a software package that models, simulates, and analyzes dynamic systems having outputs that change over time. The system level EDA tool 110 may provide a graphical user interface for building models as block diagrams. The system level EDA tool 110 may include a library of pre-defined and user-defined blocks that represent general functionalities. The functionalities may include math, logic and bit, communications, signal processing, video and image processing operations. According to one embodiment of the present invention, the system level EDA tool 110 may be implemented by Simulink® from MathWorks®.

The block library 120 is a block set that interfaces with the system level EDA tool 110. The block library 120 may link the system level EDA tool 110 with a hardware design flow tool. The block library 120 may combine algorithm development, simulation, and verification capabilities of the system level EDA tool 110 with HDL synthesis, simulation, and development tools in the hardware design flow tool. The block library 120 may also provide a variety of fixed-point arithmetic and logical operators to be used by the system level EDA tool 110.

The block library 120 includes a language converter 121. The language converter 121 converts code in one language to a second language. According to an embodiment of the block library 120, the language converter 121 converts a design in a system level representation to an HDL representation. In one embodiment, the system level representation may be a MATLAB/Simulink model description language (MDL) representation and the HDL representation may be Very High Speed Integrated Circuit (VHSIC) Hardware Description Language (VHDL) or Verilog.

The block library 120 includes a test bench generator 122. The test bench generator 122 generates stimulus files that may be used to run register transfer level (RTL) simulations. The stimulus files may be used to test a design written in HDL code. According to an embodiment of the present invention, the same stimulus used in testing the system level representation is used to test the HDL code.

The block library 120 includes a HDL interface 123. The HDL interface 123 allows the system level EDA tool 110 to utilize functions in other tools. According to one embodiment of the block library 120, the HDL interface 123 generates scripts, such as Tool Command Language (Tcl) scripts, that may be used to access synthesis, placement, and routing functions in a hardware design flow tool.

The block library 120 includes a HDL import module 124. The HDL import module 124 generates a template of a simulation model from a design written in HDL code. The simulation model may be used in system level design by the system level EDA tool 110. According to an embodiment of the block library 120, the template of the simulation model generated by the HDL import module 124 may be represented using one or more selectable options. The template for the simulation model is configured with sample times that correspond to clock signals from the design. The template also includes a plurality of input and outputs from the design.

The hardware design flow tool may be implemented by Quartus® or Quartus II® by Altera® Corporation, and the block library 120 may be implemented by DSP Builder by Altera® Corporation.

Figure 2:
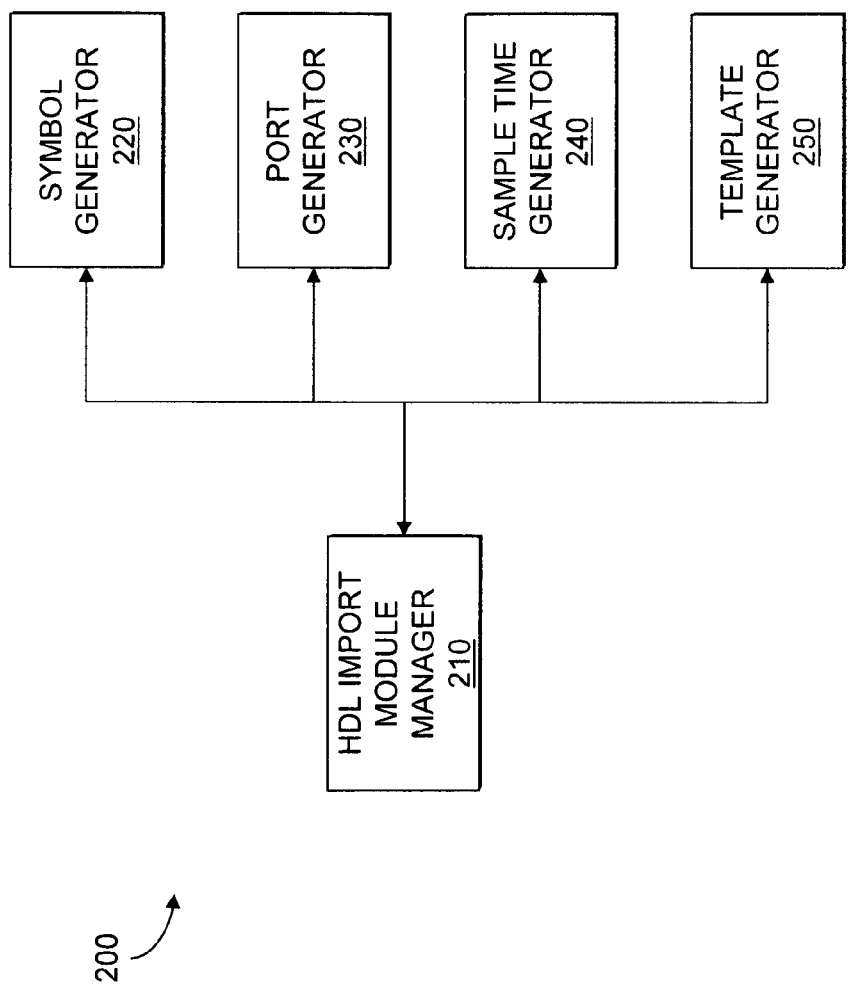
FIG. 2 illustrates a block diagram of a HDL import module according to an embodiment of the present invention.

FIG. 2 illustrates a block diagram of a HDL import module 200 according to an embodiment of the present invention. The HDL import module 200 may be implemented as the HDL import module 124 shown in FIG. 1. The HDL import module 200 includes a HDL import module manager 210. The HDL import module manager 210 interfaces with and transmits information between other modules in the HDL import module 200. The HDL import module manager 210 includes a graphical user interface. The graphical user interface allows a user to select how a simulation model is to be represented. According to an embodiment of the HDL import module 200, the HDL import module manager 210 allows a simulation model to be represented as a DSP blockset, a script, such as a MATLAB script, or a computer language description of the simulation model, such as a System (S)-Function. The graphical user interface also allows a user to identify clock and clear signals in the design that may be mapped to clock and clear signals in the system level design.

The HDL import module 200 includes a symbol generator 220. The symbol generator translates the design written in HDL code into a system level symbol that may be used by a system level EDA tool. The symbol generator 220 parses HDL code which a design is written in to determine the number of input and output ports and generates a system level symbol with the corresponding ports identified.

The HDL import module 200 includes a port generator 230. The port generator 230 receives the identified list of input and output ports by the symbol generator 220 as well as a list of parameters identified by the user that are utilized by the design. In one embodiment, the port generator 230 builds a function, InitializeSizes( ), that specifies the number of input and output ports, and parameters in the simulation model.

The HDL import module 200 includes a sample time generator 240. The sample time generator 240 sets sample times at which signals in the simulation model are to be sampled at. In one embodiment, the sample time generator 240 builds a function, InitializeSampleTimes( ), that specifies the sample times. According to an embodiment of the present invention, sample times of signals in the simulation model are set to inherit the sample times from proceeding or driving blocks by default. The sample times, however, may also be modified by a user.

The HDL import module 200 includes a template generator 250. The template generator 250 builds a frame or skeleton for computations performed by the simulation model. In one embodiment, the template generator 250 builds a frame for a function, Outputs( ), that specifies the computations performed by the simulation model. In one embodiment, the template generator 250 builds a frame for a function, Terminate( ), that specifies the procedures performed by the simulation model upon termination. The frame for the function and procedures may be completed manually by a user.

Figure 3:
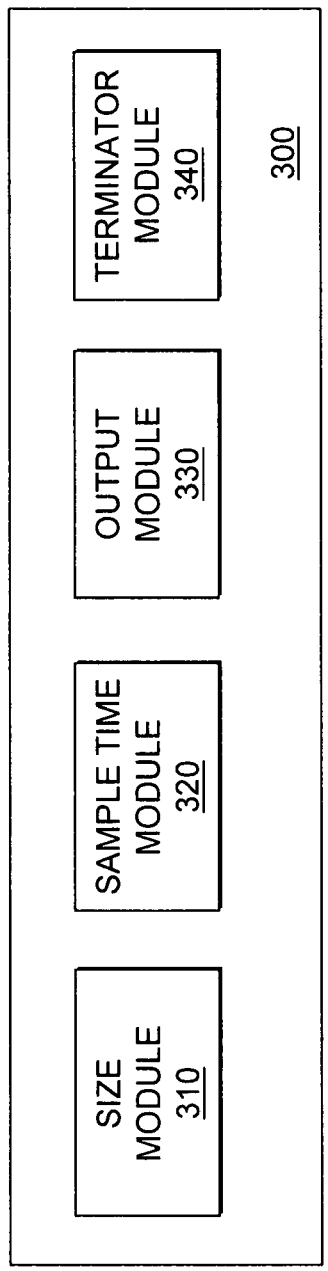
FIG. 3 illustrates a block diagram of a template of a simulation model according to an embodiment of the present invention.

FIG. 3 illustrates a block diagram of a template 300 of a simulation model according to an embodiment of the present invention. The template 300 of the simulation model may be one that is generated in part by the HDL import module 200 shown in FIG. 2. The template 300 of the simulation model may be used as a starting point for a user to create a simulation model that may be used in a system level design EDA tool. The template includes a size module 310. According to an embodiment of the template 300, the size module 310 specifies inputs, outputs, states, parameters, and other characteristics of the simulation model. The size module 310 may be implemented by a function InitializeSizes( ).

The template 300 includes a sample time module 320. According to an embodiment of the template 300, the sample time module 320 specifies sample times at which signals in the simulation model are to be sampled at. The sample times may be taken from preceding or driving blocks to the simulation model. Alternatively, sample times may be specified by the user. The sample time module 320 may be implemented by a function InitializeSampleTimes( ).

The template 300 includes an output module 330. According to an embodiment of the template 300, the output module 330 specifies the computation performed to generate outputs for the simulation model. The output module 330 may be implemented by a function Outputs. The output module 330 may be generated in part and left to be completed by a user.

The template 300 includes a termination module 340. According to an embodiment of the template 300, the termination module 340 specifies procedures to be performed by the simulation model upon termination. The termination module 340 may be implemented by a function Terminate. The termination module 340 may be generated in part and left to be completed by a user.

Figure 4:
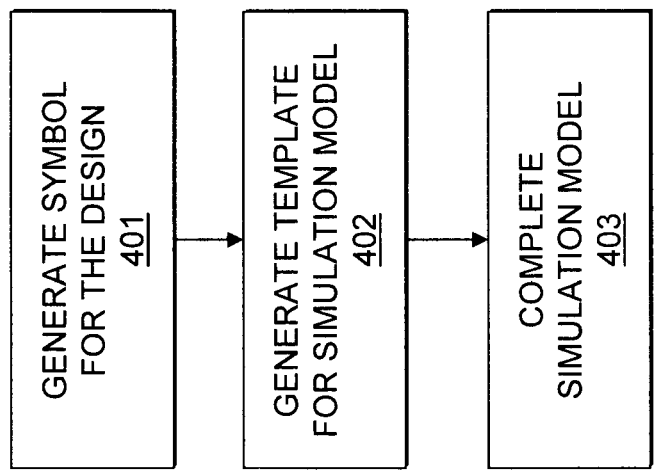
FIG. 4 is a flow chart illustrating a method for importing a design in HDL into a system level EDA tool according to an embodiment of the present invention.

FIG. 4 is a flow chart illustrating a method for importing a design in HDL into a system level EDA tool according to an embodiment of the present invention. At 401, a symbol for the design is generated for the system level EDA tool. According to an embodiment of the present invention, the symbol may be a block representation of the design.

At 402, a template for a simulation model is generated. According to an embodiment of the present invention, the template may be used to generate a simulation model of the design to be used by the system level EDA tool.

At 403, the simulation model is completed. According to an embodiment of the present invention, the simulation model is completed by a user from the template generated at 402.

Figure 5:
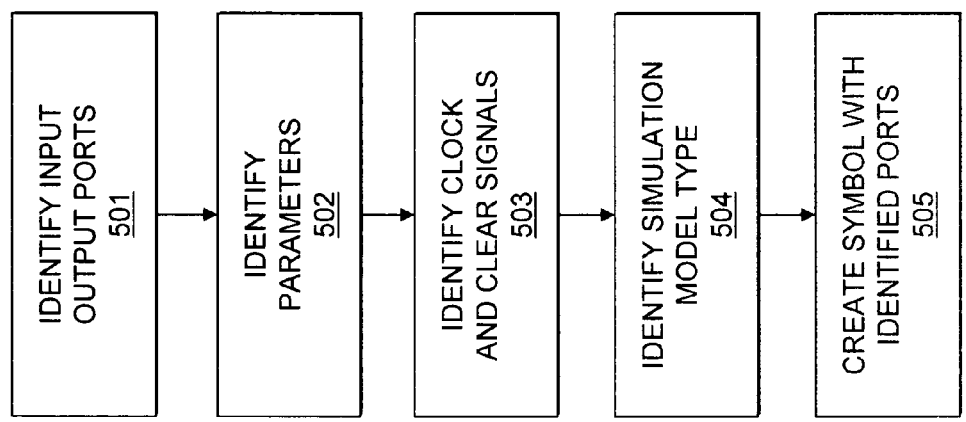
FIG. 5 is a flow chart illustrating a method for generating a symbol for a design according to an embodiment of the present invention.

FIG. 5 is a flow chart illustrating a method for generating a symbol for a design according to an embodiment of the present invention. The method shown in FIG. 5 may be used to implement 401 shown in FIG. 4. At 501, input and output ports in the design are identified. According to an embodiment of the present invention, HDL code describing the design is parsed to identify the ports.

At 502, parameters used in the design are identified. According to an embodiment of the present invention, a user is prompted to pass the parameters.

At 503, clock and clear signals are identified. According to an embodiment of the present invention, the user is prompted to identify the clock and clear signals.

At 504, a simulation model type to represent the design in a system level design tool is identified. According to an embodiment of the present invention, the user is prompted to select a simulation model type.

At 505, a symbol with the corresponding ports identified at 501 is created.

Figure 6:
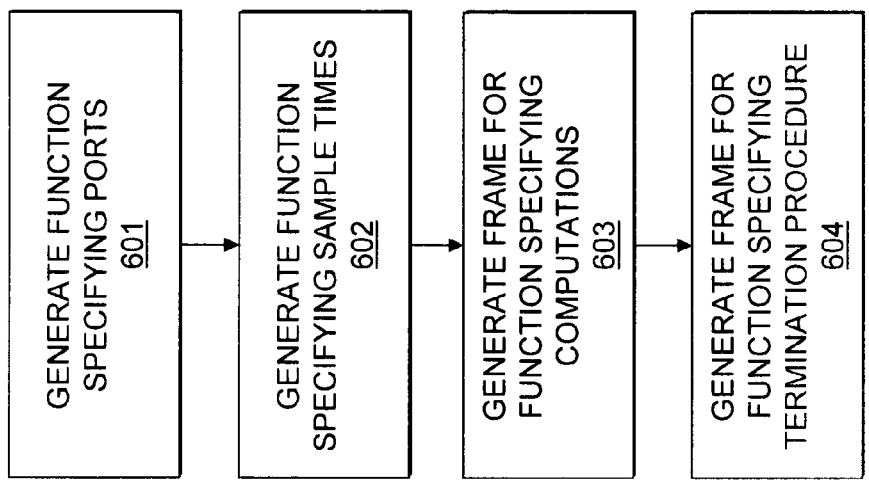
FIG. 6 is a flow chart illustrating a method for generating a template for a simulation model according to an embodiment of the present invention.

FIG. 6 is a flow chart illustrating a method for generating a template for a simulation model according to an embodiment of the present invention. The method illustrated in FIG. 6 may be implemented at 402 shown in FIG. 4. At 601, a function is generated that specifies the input and output ports, and parameters in the simulation model.

At 602, a function is generated that specifies the sample times at which signals in the simulation model are to be sampled at. According to an embodiment of the present invention, sample times of signals in the simulation model are set to inherit the sample times from proceeding or driving blocks by default. The sample times, however, may also be modified by a user.

At 603, a frame or skeleton for a function that specifies computations performed by the simulation model is generated. The function may be completed manually by a user.

At 604, a frame or skeleton for a function that specifies the procedures performed by the simulation model upon termination is generated. The function may be completed manually by the user.

FIGS. 4-6 are flow charts illustrating embodiments of the present invention. Some of the techniques illustrated in the figures may be performed sequentially, in parallel or in an order other than that which is described. It should be appreciated that not all of the techniques described are required to be performed, that additional techniques may be added, and that some of the illustrated techniques may be substituted with other techniques.

Embodiments of the present invention may be provided as a computer program product, or software, that may include a machine-readable medium having stored thereon instructions. The machine-readable medium may be used to program a computer system or other electronic device. The machine-readable medium may include, but is not limited to, floppy diskettes, optical disks, CD-ROMs, and magneto-optical disks or other type of media/machine-readable medium suitable for storing electronic instructions. The techniques described herein are not limited to any particular hardware or software configuration. They may find applicability in any computing or processing environment. The techniques may be implemented in hardware, software, or a combination of the two.

The term "machine readable medium" used herein shall include any medium that is capable of storing or encoding a sequence of instructions for execution by the machine and that cause the machine to perform any one of the methods described herein. Furthermore, it is common in the art to speak of software, in one form or another (e.g., program, procedure, process, application, module, unit, logic, and so on) as taking an action or causing a result. Such expressions are merely a shorthand way of stating that the execution of the software by a processing system causes the processor to perform an action to produce a result.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A method for importing a design in hardware description language (HDL) into a system designer, comprising:
    generating a function operable to specify a number of input and output ports that are in the design in HDL;
    setting a sample time for sampling signals of a simulation model, wherein the sample time is associated with a clock signal in the design in HDL;
    generating a simulation model template based on the function and the sample time rendering a plurality of selectable simulation model types; receiving a user selected simulation model type; and
    generating the simulation model from the simulation model template, wherein the simulation model is operable to be rendered in response to the user selected simulation model type, wherein at least one of the setting, rendering, receiving and generating procedures is performed by a computer.

2. The method of claim 1, further comprising parsing the design in HDL to identify the input and output ports.

3. The method of claim 1, wherein the clock signal is user identifiable from the design in HDL.

4. The method of claim 1, wherein the clock signal is from a driving block from the design in HDL.

5. The method of claim 1, wherein the user selected simulation model type is a computer language description.

6. The method of claim 1, wherein the user selected simulation model type is a script.

7. A non-transitory machine-readable medium having stored thereon sequences of instructions, the sequences of instructions including instructions which, when executed by a processor, causes the processor to perform a method, comprising:
    setting a sample time for sampling signals of a simulation model, wherein the sample time is associated with a clock signal in a design in hardware description language (HDL) that is imported into a system designer at which signals in a simulation model are to be sampled at;
    generating a simulation model template based on the sample time set;
    presenting a user with a plurality of selectable simulation model types;
    receiving a user selected simulation model type; and
    generating the simulation model from the simulation model template, wherein the simulation model is operable to be rendered in response to the user selected simulation model type.

8. The machine-readable medium of claim 7, wherein the method comprises parsing HDL code to identify inputs and outputs of a system.

9. The machine-readable medium of claim 7, wherein setting the sample time comprises setting the sample time using a sample time from a driving block from the design in HDL.

10. The machine-readable medium of claim 7, wherein the user selected simulation model type is a computer language description.

11. The machine-readable medium of claim 7, wherein the user selected simulation model type is a script.

12. The method of claim 7, further comprising building a skeleton for an output function.

13. A method for designing a system, comprising:
    importing a design in hardware description language (HDL) into a block library of a system designer setting a sample time for sampling signals of a simulation model, wherein the sample time is associated with a clock signal in the design for signal sampling;

generating a simulation model template based on the sample time;

presenting a user with a plurality of selectable simulation model types;

receiving a user selected simulation model type;

generating a simulation model of the design in HDL to be represented from the simulation model template, wherein the simulation model is operable to be rendered in response to the user selected simulation model type; and connecting the simulation model of the design in HDL to an available component in the block library to form the system wherein at least one of the setting, generating, presenting, receiving, and connecting procedures are performed by a processor.

14. The method of claim 13, wherein the component performs a mathematical operation.

15. The method of claim 13, wherein the component performs a logical operation.

16. The method of claim 13, wherein the component performs an image processing operation.

17. The method of claim 13, wherein the user selected simulation model type comprises a DSP blockset.

18. The method of claim 13, wherein the user selected simulation model type is a script.

19. The method of claim 13, wherein the use selected simulation model type is a computer language description.

* * * * *